March 25, 1969 M. F. MICKELSON ET AL 3,434,939

PROCESS FOR MAKING PRINTED CIRCUITS

Filed Oct. 7, 1965

INVENTORS
MERLYN F. MICKELSON
THOMAS D. BROWN
BY Braddock + Burd
ATTORNEYS 3,434,939

PROCESS FOR MAKING PRINTED CIRCUITS

Merlyn F. Mickelson, Minneapolis, and Thomas D. Brown, Hopkins, Minn., assignors to Fabri-Tek Incorporated, Minneapolis, Minn., a corporation of Wisconsin Filed Oct. 7, 1965, Ser. No. 493,651
Int. Cl. C23b *5/48*
U.S. Cl. 204—15 5 Claims

ABSTRACT OF THE DISCLOSURE

A process for making printed circuit boards in which a thermoformable electrically insulating base which is clad with a thin electrically conductive metal layer, is subjected to heat and pressure in contact with a heated die having projections in the reverse pattern of the desired circuit configuration to form recesses in the metal clad face of the base conforming to the circuit configuration. The metal clad layer is drawn and formed by the die and deposited on the walls and bottom of the recesses. The metal cladding covering the top surface of the base in the areas between the recesses is then removed, as by abrading, to leave the circuit configuration as defined by the metal cladding in the recesses. Optionally, a further electrically conducting material is electroplated over the metal clad surfaces after the recesses are formed and before the excess clad metal is removed to deposit further electrically conducting material within the recesses.

This invention relates to a process for making printed circuits in thermoformable synthetic resinous electrically insulating base material which is clad with a layer of electrically conductive metal. The metal clad laminate is first subjected to heat and pressure in contact with a die or forming plate having projections on its contacting surface corresponding to the desired circuit configuration, but in negative or reverse pattern. The desired circuit configuration is impressed into the metal clad base material. The base material is then ground or abraded to remove the electrically conductive metal from the surfaces of the base material except for that which remains in the impressed recesses to leave the desired circuit configuration.

If the original layer of electrically conductive metal is relatively thin, then following the impression of the desired circuit configuration into the metal clad base material, the impressed surface is electroplated with an electrically conductive metal. Thereafter, the base material is ground or abraded to remove the electroplated coating and metal cladding from the surfaces of the base material except for that which remains in the impressed recesses to leave the desired circuit configuration.

The invention is illustrated in the accompanying drawings in which the same numerals identify corresponding parts and in which.

Figure 1:
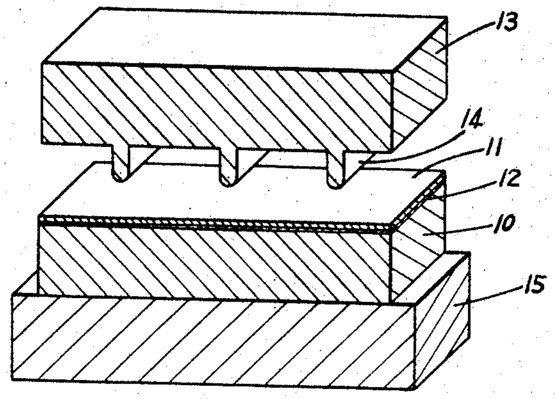
FIG. 1 is a fragmentary isometric section showing a metal clad laminate and forming die prior to impression of the laminate by the die.
Figure 2:
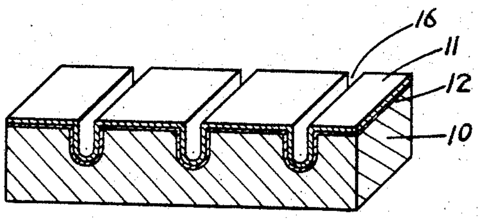
FIG. 2 is a similar view showing the laminate after impression.
Figure 3:
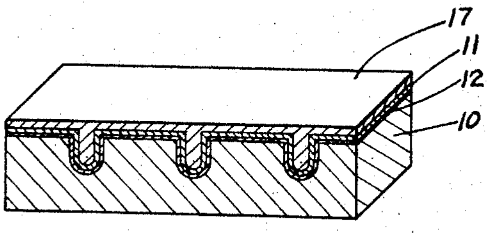
FIG. 3 is a similar view showing the impressed laminate after electroplating.
Figure 4:
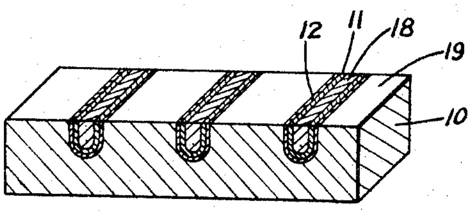
FIG. 4 is a similar view showing the completed circuit board after removal of the electroplated coating and excess metal cladding.

Referring now to the drawings, there is shown a metal clad laminate comprised of a thermoformable base 10 covered with a relatively thin layer 11 of an electrically conductive metal usually secured to the base by means of a thin layer of adhesive or similar bonding agent 12. The base or substrate 10 is formed from a thermoformable synthetic resinous material, such as thermoplastic resins or semi-cured or similarly thermally activated thermosettable resins. Exemplary materials include epoxy resins, malamine - formaldehyde, phenyl - formaldehyde, urea-formaldehyde, polyesters, silicons, flurocarbons, acrylic resins, polystyrene and the like. Semi or partially cured thermosettable resins are preferred so as to form a circuit board which will withstand any heat developed in the finished circuit without deformation of the base. The substrate laminate may have a base of paper, glass fiber, other fibers or the like. The metal cladding is ordinarily copper or aluminum although it may be any conductive metal, such as stainless steel, gold, silver, rhodium, or alloys of any of these. Clad laminates for printed circuit boards are well known and are commercially available. Typical laminates are described in specifications such as Mil-P-13949, NENA specifications and the like.

A die or forming plate 13 is provided with projecting elements 14 on one surface in a pattern conforming to the negative or reverse of the desired configuration of the elements to be formed on the printed circuit board. The die 13 is first heated to a temperature high enough to cause the thermoformable base material 10 to flow. The base 10 is placed in a power press, either hydraulic or mechanical, preferably on a heated platen 15 with its metal cladding 11 exposed for contact with the die. Sufficient pressure is applied to the die to cause the die elements 14 to be forced into the surface of the base to form recesses or impressions in the base conforming to the desired circuit configuration. The die draws the metal cladding layer 11 down into the formed recesses 16. Where the base 10 is formed from a preferred heat hardenable material, the application of heat and pressure to the metal clad base in contact with the heated die serves the combined function of impressing the circuit configuration into the surface of the base and also hardening the base.

After removal from the press the base bearing the impression of the desired circuit configuration is subjected to an electroplating bath to apply a surface coating 17 of electroplated metal over the metal clad surface and to deposit metal within the recesses 16 to form circuit elements 18. After the electroplated metal is deposited to the desired depth the coated base is removed from the plating bath. Then the electroplated coating 17, along with the surface portion of the metal cladding 11, is removed to expose areas 19 of the insulating substrate. The excess metal may be removed by sanding or otherwise abrading, grinding, milling or the like. Only the desired circuit configuration, composed of the electrodeposited circuit elements 18 and the portion of metal cladding 11 lining the recesses, is left. Depending upon the amount of metal deposited by electroplating in the recesses 16, the circuit elements 17 may be either flush with the exposed insulating surfaces 19 or may be very slightly below it.

In most instances the metal layer 11 is of a malleable metal such that it may be easily drawn so as to line the wall surfaces of the recesses 15 without rupture. However, even if the clad metal layer 11 is ruptured as a result of formation of the recesses in the base, sufficient metal remains lining the opposite side walls of the recess to permit satisfactory deposit of the electroplated metal within the recesses 16.

The electroplated coating and electroplated circuit elements 17 are desirably formed from tin-lead, nickel, gold, rhodium, tin-nickel, or similar electrically conductive metals and metal alloys which are readily electroplated by conventional means. The printed circuit board with recessed circuit elements in the desired circuit configuration is initially formed to the desired size and shape. After removal of the excess electroplated metal the circuit board is completed by conventional methods of printed circiut manufacture by the application of connectors, eyelets, sockets, various electronic components, and the like, depending upon the utilization to be made of the completed board.

If the layer 11 of electrically conductive metal on thermoformable base 10 is of sufficient thickness to avoid rupture due to the forming process, then the above described electroplating sequence can be omitted without significant variance in the final product. The above described abrading process would then be applied directly to the layer 11 to expose areas 19 of the insulating substrate.

The embodiments of the invention in which an exclusive property or privilege is claimed are defined as follows:

1. A process for making printed circuits which comprises:

(A) providing a thermoformable electrically insulating base which is clad with a thin electrically conductive metal layer, (B) subjecting said base to heat and pressure in contact with a heated forming die having projections in the reverse pattern of the desired circuit configuration to form recesses in the metal clad face of the base conforming to said circuit configuration, the metal layer being drawn and formed so as to be deposited on the walls and bottom of said recesses, (C) electroplating a coating of electrically conducting material over the metal clad surfaces of the base bearing said recesses, and then (D) removing said metal cladding and electroplated coating from the top surface of the base to expose the insulating base in the areas between said recesses to leave said circuit configuration defined by said metal cladding and electroplated material in said recesses.

2. A process according to claim 1 further characterized in that said insulating base is partially cured thermosettable synthetic resin settable under said heat and pressure by which said recesses are formed in said base.

3. A process according to claim 2 further characterized in that said insulating base is an epoxy resin clad with copper sheeting.

4. A process according to claim 3 further characterized in that said electroplated material is selected from the class consisting of tin-lead, nickel, gold, rhodium and tin-nickel.

5. A process according to claim 1 further characterized in that said metal cladding and electroplated coating is removed by abrasion.

References Cited

UNITED STATES PATENTS

| | | | |
|---|---|---|---|
| 2,702,270 | 2/1955 | Donahue et al. | 204—192 |
| 2,757,443 | 8/1956 | Steigerwalt et al. | 29—625 |
| 2,912,746 | 11/1959 | Oshry | 29—625 |
| 2,988,839 | 6/1961 | Greenman | 41—37 |
| 3,042,591 | 7/1962 | Cado | 204—15 |

ROBERT K. MIHALEK, *Primary Examiner.*

T. TUFARIELLO, *Assistant Examiner.*

U.S. Cl. X.R.

29—625; 156—8